(12) United States Patent
Bugeja

(10) Patent No.: US 6,661,365 B1
(45) Date of Patent: Dec. 9, 2003

(54) CIRCUIT ARCHITECTURES AND METHODS FOR A/D CONVERSION

(75) Inventor: Alexander Bugeja, Acton, MA (US)

(73) Assignee: Engim, Incorporated, Acton, MA (US)

( * ) Notice: Subject to any disclaimer, the term of this patent is extended or adjusted under 35 U.S.C. 154(b) by 0 days.

(21) Appl. No.: 10/135,187

(22) Filed: Apr. 29, 2002

Related U.S. Application Data

(60) Provisional application No. 60/287,396, filed on Apr. 30, 2001.

(51) Int. Cl.$^7$ .................................. H03M 1/36
(52) U.S. Cl. .................. 341/160; 341/158; 341/157
(58) Field of Search ................. 341/120, 158, 341/159, 160, 157

(56) References Cited

U.S. PATENT DOCUMENTS

| | | | | |
|---|---|---|---|---|
| 4,975,702 A | * | 12/1990 | Bazes .......................... | 341/155 |
| 5,010,338 A | * | 4/1991 | Miki et al. ................... | 341/159 |
| 5,557,275 A | * | 9/1996 | van Valburg et al. ....... | 341/160 |
| 5,602,551 A | * | 2/1997 | Fukumoto et al. .......... | 341/136 |
| 6,084,538 A | * | 7/2000 | Kostelnik et al. ........... | 341/120 |
| 6,204,794 B1 | | 3/2001 | Bult ............................. | 341/155 |
| 6,255,979 B1 | | 7/2001 | Allee et al. ................. | 341/159 |
| 6,340,943 B1 | | 1/2002 | Chow et al. ................ | 341/161 |

OTHER PUBLICATIONS

Ono et al., *Error Suppressing Encode Logic of FCDL in –bit Flash A/D Converter*, IEEE Proceedings of the 1996 Bipolar/BiCMOS Circuits and Technology Meeting, 1996., pp. 200–203.*

Silburt et al., *A novel multiple threshold MOSFET structure for A/D and D/A conversion*, IEEE Journal of Solid–State Circuits, Oct. 1984, vol. 19, No. 5, pp. 794–802.*

Yoo, J., et al., "1–GSPS CMOS Flash Analog–to–Digital Converter for System–on–Chip Applications," In Proc. IEEE Computer Society Workshop on VLSI, pp. 123–456 (Apr., 2001).

Yoo, J., et al., "Future–Ready Ultrafast 8bit CMOS ADC for System–on–Chip Applications," In Proc. IEEE Int'l ASIC/SOC Conf., pp. 789–793 (Sep. 2001).

* cited by examiner

*Primary Examiner*—Howard L. Williams
(74) *Attorney, Agent, or Firm*—Hamilton, Brook, Smith & Reynolds, P.C.

(57) ABSTRACT

An array of transistor circuits is fabricated so that each transistor circuit in an array of transistor circuits has a switching threshold determined by intrinsic switching thresholds of at least one sensing transistor in a corresponding transistor circuit. The sensing transistors in a set of transistor circuits of the array can be fabricated to have common physical dimensions even though corresponding intrinsic switching thresholds of the transistor circuits can vary. Switching thresholds of the transistor circuits can vary based on an applied well bias voltage. Alternatively, the switching threshold of each transistor circuit can be set to a common value and a tapped delay line can be coupled to the transistor circuits. Consequently, an A/D converter device can be fabricated by coupling an encoder, and a calibration circuit if necessary, to the output of the array of transistor circuits.

16 Claims, 10 Drawing Sheets

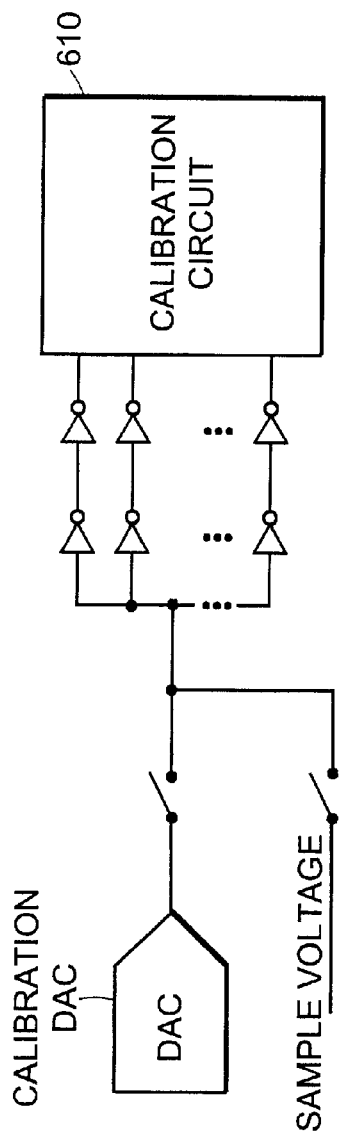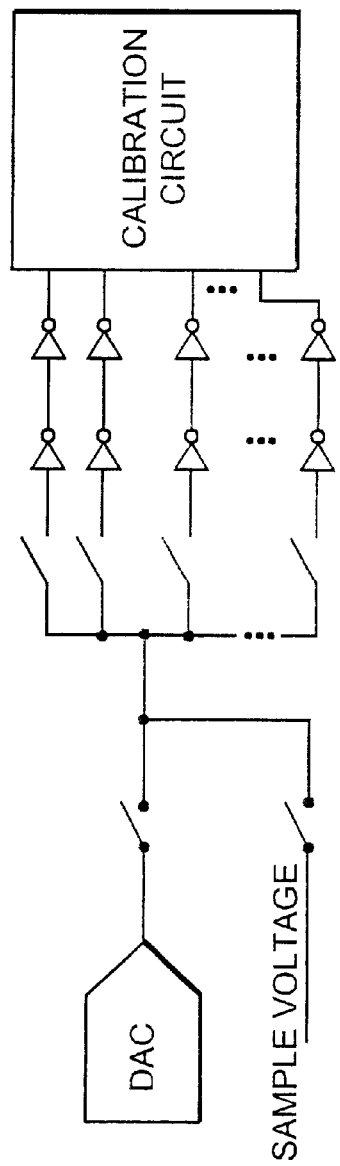
FIG. 6
FIG. 7

| ADDRESS FIELD | BANK # | MUX ADDRESS | TRANSITION ZONE BITS |
|---|---|---|---|
| CALDAC I/P VOLTAGE | | | |
| 000000000000 | 1 | | 100100 |
| | 1 | | 101100 |
| | 1 | | 101101 |
| | 1 | | 101111 |
| ... | | | |
| 111111111111 | | | |

\# OF OR GATE ACTIVATED

SEGMENT

INFORMATION FOR REVERSE LOOKUP TABLE NORMAL GENERATION

CIRCUIT ARCHITECTURES AND METHODS FOR A/D CONVERSION

RELATED APPLICATION(S)

This application claims the benefit of U.S. Provisional Application No. 60/287,396 filed on Apr. 30, 2001, the entire teachings of which are incorporated herein by reference.

BACKGROUND OF THE INVENTION

Certain flash Analog-to-Digital (A/D) converters are capable of converting an analog input directly into a digital output in a single clock cycle. Such devices are therefore advantageously used in applications requiring high speed A/D conversions. Unfortunately, the resolution of flash A/D converter circuits tends to be limited compared to pipelined, cyclic, or over-sampled A/D converter circuits, which typically provide more accurate A/D conversions.

Internally, flash A/D converters often employ a string of voltage or current references followed by appropriate gain elements (voltage or current amplifiers) to amplify the difference between an applied analog input voltage and each of multiple reference voltages. Outputs of the gain elements are typically coupled to a string of comparator circuits that produce a digital output representative of the applied analog input voltage. One drawback, therefore, of flash A/D devices is the complex circuitry that is often necessary to implement high speed designs.

SUMMARY OF THE INVENTION

One aspect of the present invention is directed towards providing more desirable A/D converter circuits and methods than taught in the prior art.

In an illustrative embodiment, an array of transistor circuits is fabricated so that each transistor circuit in an array of transistor circuits has a switching threshold determined by intrinsic switching thresholds of at least one sensing transistor in a corresponding transistor circuit. The sensing transistors in a set of transistor circuits of the array can be fabricated to have common physical dimensions even though corresponding intrinsic switching thresholds of the transistor circuits can vary. Consequently, an A/D converter device can be fabricated by coupling an encoder to the output of the array of transistor circuits having unique switching thresholds.

In another embodiment of the present invention, an array of transistor circuits can include sensing transistors that have intrinsic switching thresholds that change depending on an applied reference voltage. More specifically, a switching threshold of the sensing transistors can be changed by setting respective bias voltages associated with corresponding transistor circuits. The sensing transistors need not be of a common physical dimension.

A gradient bias voltage can be produced by applying one or multiple reference voltages at contact points on a substrate so that different well biasvoltages are produced along the length of the substrate. Accordingly, an input voltage can be applied to an array of transistor circuits having different switching thresholds to produce a digital output that varies depending on the input voltage. The digital output of the transistor circuits can be decoded to determine the value of an analog input.

As mentioned, a set of transistor circuits in an array can be fabricated to have common physical dimensions. In one application, all of the sensing transistors in the array of transistor circuits have common physical dimensions. For example, each sensing transistor in the array can be fabricated so they are substantially the same size with each other even though corresponding intrinsic thresholds of the circuits vary.

A transistor circuit can include a complementary pair of transistors to form a functional electronic device. For example, a transistor circuit can include a pair of transistors fabricated using CMOS (Complementary Metal Oxide Semiconductor) technology. More specifically, a p-type FET (Field Effect Transistor) and n-type FET can be fabricated into an inverter or buffer circuit whose intrinsic switching threshold depends on an applied well biasvoltage. Other suitable technology can be used in lieu of CMOS fabrication techniques according to the principles of the present invention. Also, the array of transistor circuits is not limited to an array of inverters or buffers.

An array of transistor circuits can be fabricated in a semiconductor substrate including n-well and p-well regions. More specifically, an n-FET device can be fabricated in a p-well substrate while a complementary p-FET device can be fabricated in an n-well substrate. As mentioned, the combination of n-FET and p-FET devices can produce an inverter circuit whose output depends on an applied input voltage and a corresponding applied well biasvoltage.

An array of transistor circuits can be fabricated along a length of complementary p-type and n-type substrates. To vary the switching threshold of the transistor circuits such as inverters, a first reference voltage can be applied to one contact point of a substrate while a second reference can be applied to another contact point on the substrate. Consequently, a gradient voltage can be produced along a length of a substrate and, thus, well biasvoltages applied to transistor circuits formed in the substrate can vary along its length.

When the well biasvoltages applied to the transistor circuits varies depending on a position of the transistor circuit along the substrate, the switching thresholds of transistor circuits also varies along a length of the substrate. Thus, for a range of potential input voltages, a digital output of the array can be unique. In other words, a change in the input voltage can cause certain transistor circuits to change a state of their output. Thus, a user can determine a value of an input voltage based on the output of the array of transistor circuits.

In another embodiment, a switching threshold of each transistor circuit in an array of transistor circuits can be substantially similar so that at least a set of the multiple transistor circuits have a common switching threshold. More specifically, unique bias voltages are not necessarily applied to each and every transistor circuit in an array of transistor circuits.

Outputs of a tapped delay line can be coupled to inputs of the transistor circuits having a common switching threshold to produce an A/D device. In a specific application, each output tap of the tapped delay line includes a resistor-capacitor pair that is coupled to a corresponding transistor circuit. An input voltage is applied to one end of the tapped delay line so that the input voltage is minimally delayed at a near end of the tapped delay line while the input voltage is maximally delayed at the end of the delay line. Depending on a time when outputs of the transistor circuit changes state, a value of an input voltage applied to the tapped delay line can be determined.

Initially, the capacitors in the tapped delay line can be shorted to ground. Thereafter, an input voltage can be applied to the input of the tapped delay line. Depending on the level of the input voltage, certain outputs of the transistor circuits will trip to an opposite state at a predetermined time following application of the input voltage. A latch can be used to store a state of the output of the transistor circuits.

An array of transistor circuits can be calibrated by applying a known input voltage from a voltage source such as a DAC (Digital-to Analog converter) to the array of transistor circuits and determining an output bit sequence produced by the array of transistor circuits. The bit sequence can include a transition region of bits that correlate to the value of a particular input voltage.

The previously discussed aspects of the present invention are advantageous over the prior art. Specifically, an A/D converter device manufactured according to the principles of the present invention can be fabricated from an array of transistor circuits having at least some common physical dimensions. For instance, a sensing transistor of each transistor can be fabricated using common widths and lengths in a CMOS implementation. This aspect of the present invention alleviates the need to painstakingly change device settings to produce multiple uniquely sized transistor circuits to vary inherent switching thresholds of the transistor circuits. Further, any variation across the array are readily overcome through calibration. Circuitry of the A/D converter device according to the principles of the present invention is therefore simpler to manufacture and is less prone to fabrication defects.

In many applications such as those based on CMOS technology, A/D converters can be fabricated using fewer transistor devices or complex circuitry than used in the prior art. For example, a string of inverter devices having unique switching threshold characteristics can be employed in an A/D converter device. An inverter circuit is a simple implementation of both gain and comparator elements. Gain is inherent in the switching action of an inverter while the input/output characteristics of an inverter resemble those of a comparator. Functionality provided by a string of comparators and complex resistor ladder networks as in the prior art can be replaced with a string of inverter devices or buffers without the need for device size variation across the array as in the prior art. Since each transistor circuit or part thereof, is approximately equal in physical dimensions, the transistor circuits need not be unnecessarily large so that they are slow or cause excess power consumption. A use of large inverters can cause considerable loading on the front end sample/hold circuit driving the input of an input of the ADC. Such devices typically provide poor speed (bandwidth).

Another aspect of the present invention is directed towards a system and method of storing bit sequences in memory. For example, analog-to-digital conversions are supported by generating a string of bits corresponding to an input voltage. A contiguous bit sequence in the string of bits corresponding to a transition zone is then identified in which at least two adjacent bits are set to different logic levels. Based on a location of the contiguous bit sequence in the string of bits, at least a portion of the contiguous bit sequence is stored in memory along with a corresponding voltage value.

In one application, the string of bits is generated by applying an input voltage to an array of inverter circuits having different thresholds. Thus, the string of bits can be a difference code.

The memory for storing bit information can be divided into multiple segments. A segment of the memory can be allocated for storing multiple unique contiguous sequences of bits for different input voltages to an analog-to-digital converter device. Thus, each segment in memory can correspond to a location of the transition zone within a sequence of bits. Hence, multiple unique contiguous bit sequences in a segment can correspond to a set of possible A/D input voltages. Consequently, an input voltage can be identified by knowing the location of a transition zone and thereafter matching the transition zone of bits in a corresponding segment to a stored voltage value for the unique sequence of bits in the transition zone.

Yet another aspect of the present invention is directed towards a system and method of supporting A/D conversions. For example, an input voltage can be applied to an array of comparator circuits having different thresholds to generate a string of bits. At least one comparator circuit in the array can be selected or effectively removed from the circuit so it can be calibrated while a balance of the array of comparator circuits in the array are used to generate a digital output corresponding to an input voltage. In one application, the array of comparator circuits is an array of inverter circuits having different thresholds producing a thermometer or difference code. Consequently, an A/D converter circuit can be calibrated while it is used to perform A/D conversions.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 6 is a circuit diagram for calibrating an A/D converter device according to certain principles of the present invention.

FIG. 7 is a circuit diagram for calibrating an A/D converter device according to certain principles of the present invention.

FIG. 10 is a look-up table according to certain principles of the present invention.

DETAILED DESCRIPTION OF THE INVENTION

A description of preferred embodiments of the invention follows.

Figure 1:
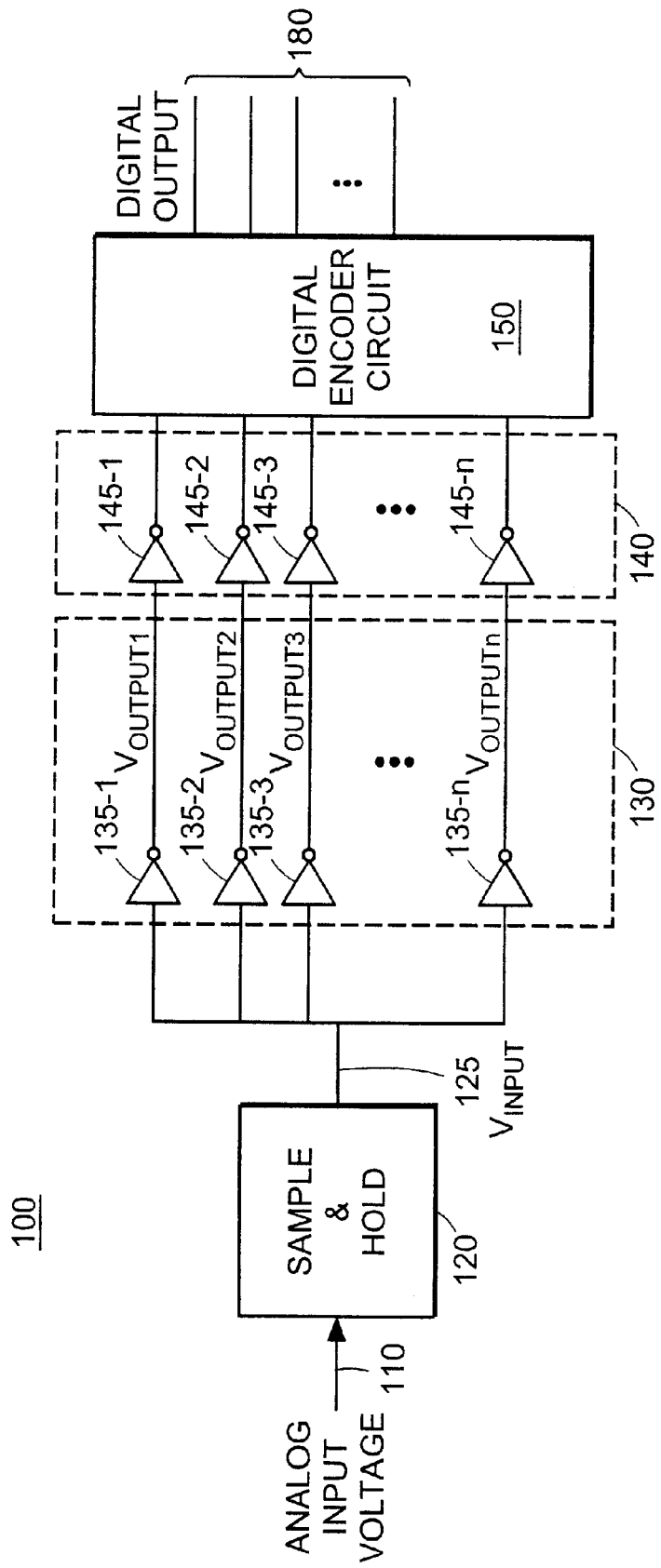
FIG. 1 is a circuit diagram of an A/D converter device according to certain principles of the present invention.

FIG. 1 is a circuit diagram of an A/D device according to certain principles of the present invention. Generally, circuit 100 can be used to convert an applied analog input voltage 110 into a corresponding digital output 180.

Analog input voltage 110 drives sample and hold circuit 120. At a specific sample time, sample and hold circuit 120 samples input voltage 10 to create sample voltage 125, which is approximately equal to the instantaneous value of input voltage 110 at the sample time. Sample voltage 125 drives array of transistor circuits 130 such as a string of inverter circuits 135-1, 135-2, . . . 135-n. A number and type of transistor circuits can vary depending on the application. For example, array 130 can include thousands of inverter or buffer circuits fabricated, at least in part, from transistors.

Use of sample and hold circuit 120 can relax settling time requirements on successive stages of A/D converter device 100. However, sample and hold circuit 120 can be omitted in certain lower speed A/D converter applications.

Switching threshold characteristics of each inverter circuit 135 or set of inverter circuits 135 in array 130 can vary. For example, in one application, a switching threshold of inverter circuit 135-1 can be set to 0.1 volts. Additionally, a switching threshold of inverter circuit 135-2 can be set to 0.2 volts, while inverter circuit 135-3 can be set to 0.3 volts, and so on. In this way, each successive inverter circuit in array 130 can have a higher switching threshold. Thus, when sample voltage 125 is 0.25 volts, outputs $V_{output1}$ and $V_{output2}$ of corresponding inverter circuits 135-1 and 135-2 will be a logic high because the input sample voltage is above their corresponding switching threshold values of 0.1 and 0.2 volts, respectively. This generally results from the switching nature of an inverter circuit. That is, when an input to an inverter circuit 135 is below a switching threshold, the output of the inverter circuit is logic high and vice versa.

Also, while sample input voltage is 0.25 volts, outputs of inverter circuit 135-3 (set to have a switching threshold of 0.3 volts) and other inverter circuits 135 having successively higher thresholds will produce a logic low output because the input sample voltage is below the switching thresholds of corresponding inverter circuits 135. Encoder circuit 150 senses the state of inverter circuits 130 to produce digital output 180 that uniquely identifies a state of the inverter circuits 130. In this way, the value of digital output 180 varies depending on an applied analog input voltage 110 and, more specifically, sample voltage 125.

Voltage outputs $V_{output1}$, $V_{output2}$ . . . $V_{outputn}$ drive an optional stage of transistor circuits 140 such as inverter circuits or buffers. This optional stage of transistor circuits 140 can be used to ensure that the digital output state of each inverter 135 is definitively a logic high or logic low state before it is fed into encoder circuit 150. Typically, switching thresholds of each inverter 140-1, 140-2, . . . 140-n are set to a common value such as 1.4 volts. This common threshold setting can vary depending on the application. Also, it is not necessary that each transistor circuit in the optional stage of transistor circuits be set to a common switching threshold. For example, thresholds of inverter circuits 140 can also vary.

Outputs of transistor circuit array 140 are coupled to encoder circuit 150 that in turn produces digital output 180, which varies depending on a value of sample voltage 125. As in many A/D converter devices, each bit in digital output 180 can be appropriately weighted so that a user can identify the value of sample voltage 125 based upon a bit sequence. Although digital output 180 is a parallel sequence output of bits, encoder circuit 150 is optionally designed to produce a serial stream of output bits.

Resolution of A/D device 100 can vary depending on a number of transistor circuits such as inverter circuits 135 that are used in array 130. For example, more inverter circuits, each having more closely spaced but unique switching thresholds can be used to produce an A/D circuit 100 having a higher resolution. More specifically, inverter circuit 135-1 can be fabricated to have a switching threshold of 0.01 volts, inverter circuit 135-1 can be fabricated to have a switching threshold of 0.02 volts, and so on such that a switching threshold of each inverter circuits is spaced by approximately by 0.01 volts. Thus, to support an input voltage range of 5 volts and an A/D resolution of 0.01 volts, such an A/D would include at least 500 inverter circuits 135, each having a unique switching threshold spaced by 0.01 volts.

In one application, threshold settings start at an offset value such as 1.0 volts. Consequently, a threshold of inverter circuit 135-1 can be set to 1.00 volts, while a switching threshold of inverter circuit 135.2 is set to 1.01 volts, a switching threshold of inverter circuit 135-2 is set to 1.02 volts, and so son. Sample and hold circuit 120 can produce an offset signal. For example, sample and hold circuit can be designed to add 1.0 volts to input voltage 110. If input voltage 110 is 1.3, sample voltage 125 can be 2.3 volts.

It should be noted that tolerances of the switching thresholds of inverter circuits 135 can vary depending on the application. In certain cases, therefore, two or more transistor circuits can have approximately equal switching thresholds due to tolerances in the fabrication process. Since it is desirable that at least one inverter circuit change state upon changing the input voltage by one LSB (Least Significant Bit) defining a resolution of circuit 100, additional or redundant inverter circuits 135 can be interspersed in array 130 than otherwise necessary if each inverter circuit was set to an ideal threshold voltage value. In other words, a use of additional inverter circuits 135 can ensure that digital encoder 150 detects a state change of at least one inverter circuit 135 upon changing sample voltage 125 by, for example, 0.01 volts. The number of such additional inverter circuits 135 can be calculated depending on a desired fixed yield requirement for A/D circuit 100 and desired resolution.

As discussed, A/D converter 100 can be calibrated so that encoder circuit 150 generates a unique binary output word depending on an applied sample voltage 125. For example, since a change in the input voltage by a predetermined amount causes at least one inverter circuit 135 in array 130 to change states, a state of $V_{output1}$, $V_{output2}$ . . . , $V_{outputn}$ will change. Based on a detected state of the array of transistor circuits 130, encoder circuit can generate a corresponding unique word mapping back to the sample voltage 125.

In one application, array of transistor circuits 130 employs the back-gate effect to vary the threshold voltages of sensing transistors in the inverter circuits 135 and, therefore, the threshold voltages of the inverter circuits 135. Generally, a bias voltage can be applied to a corresponding transistor circuit such as inverter 135 to set its switching threshold characteristics. This aspect of the present invention will be discussed in greater detail later in this specification.

As previously discussed, sample voltage 125 can simultaneously drive an array of transistor circuits 130 such as a string of inverter circuits 135. In this instance, connecting sample voltage 125 to inputs of multiple inverter circuits 135 can cause excessive loading if the array of transistor circuits are improperly sized. That is, if the inverter circuits are too large in size, sample voltage 125 can be unnecessarily distorted causing A/D converter 100 to produce inaccurate readings. To reduce this negative loading effect, each inverter circuit 135 can be fabricated to be relatively small in size or approximately equal in size to each other. Although an array of transistor circuits 130 can be fabricated to be of approximately equal size, certain aspects of the transistor circuits can be adjusted such as physical dimensions to further differentiate corresponding switching thresholds form each other.

Figure 2:
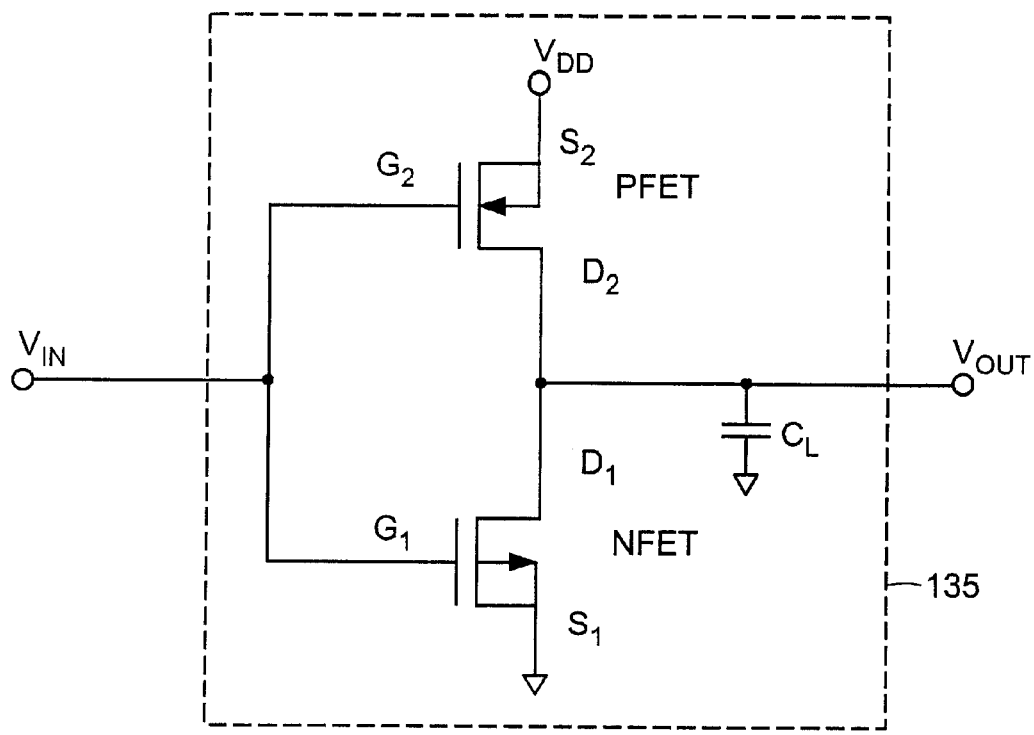
FIG. 2 is an FET (Field Effect Transistor) circuit based on CMOS (Complementary Metal Oxide Semiconductor) technology.

FIG. 2 is diagram of an inverter circuit using CMOS technology. As shown, an output voltage depends on a switching threshold of inverter 135 and an applied input voltage, Vin. Generally, inverter circuit 135 has a high input impedance and a low output impedance.

Figure 3:
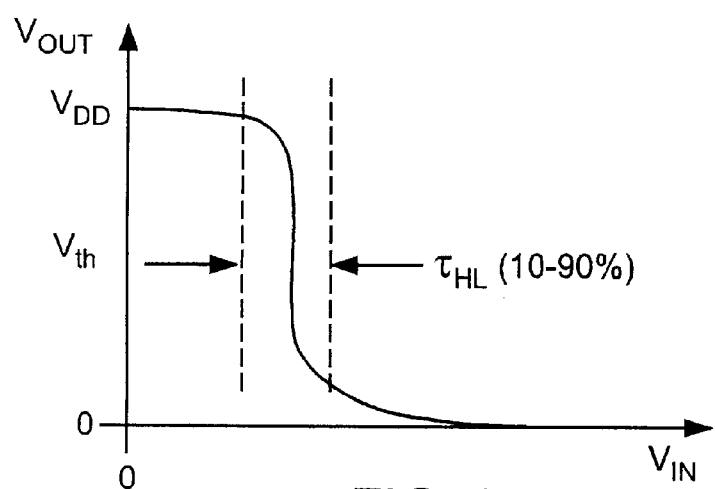
FIG. 3 is a graph illustrating operational characteristics of the FET circuit illustrated in FIG. 2.

FIG. 3 is a graph illustrating switching characteristics of the inverter circuit shown in FIG. 2. A switching threshold, Vth, can be calculated using the equation:

$$V_{th} = \frac{V_{Tn} + \sqrt{\frac{1}{K_r}}(V_{DD} + V_{Tp})}{\left(1 + \sqrt{\frac{1}{K_R}}\right)}$$

$$K_R = \frac{Kn}{Kp} \text{ and}$$

$$\lambda_{HL} = \frac{C_L}{Kn(V_{DD} - V_{Tn})}\left[\frac{2V_{Tn}}{V_{DD} - V_{Tn}} + \ln\left(\frac{4(V_{DD} - 1)}{V_{DD}}\right)\right]$$

The characteristics of the simple CMOS inverter, and the equation for the threshold voltage are shown in FIG. 2. Here kr is the ratio kn/kp, where kx=uxCox and is the basic transistor gain parameter in CMOS. As expected the threshold voltages of the individual transistors Mn and MP, Vtn and Vtp respectively, enter into the equation for the threshold voltage of the inverter Vth, and may thus be used as knobs to alter Vth over the dynamic range of the input. The threshold voltage of the devices also enters in the propagation times of the inverters (the relevant equation is also shown in FIG. 2 for the fall time tHL; a similar (dual) expression holds for tLH), so it may be convenient in some cases not to make the Vtn/Vtp variation too extreme and instead use other transistor features, such as W and L (width and length dimensions of the transistors wells) to limited extent also to increase the dynamic range of the input if necessary. The use of thresholds Vtn and Vtp greatly extends the dynamic range for inverters with sizes close to minimum, however.

Figure 4:
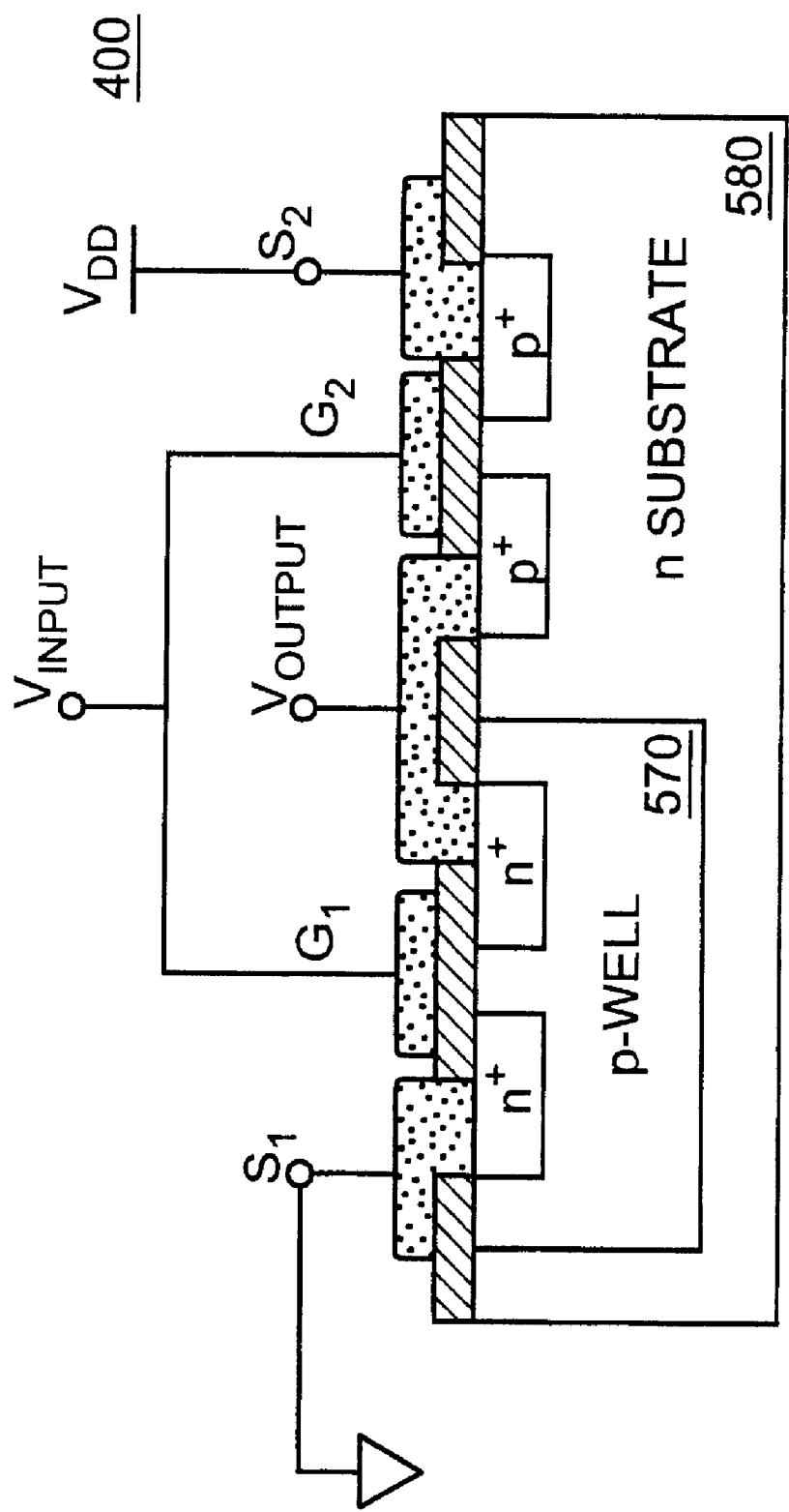
FIG. 4 is a cross-sectional view of the FET circuit illustrated in FIG. 2.

FIG. 4 is a cross-sectional view of inverter circuit 135 formed in corresponding p-well and n-well substrate 570 and 580, respectively. Although diagram 400 illustrates use of CMOS technology to fabricate an inverter 135, other suitable types of technology can be used to exploit the principles of the present invention.

Figure 5:
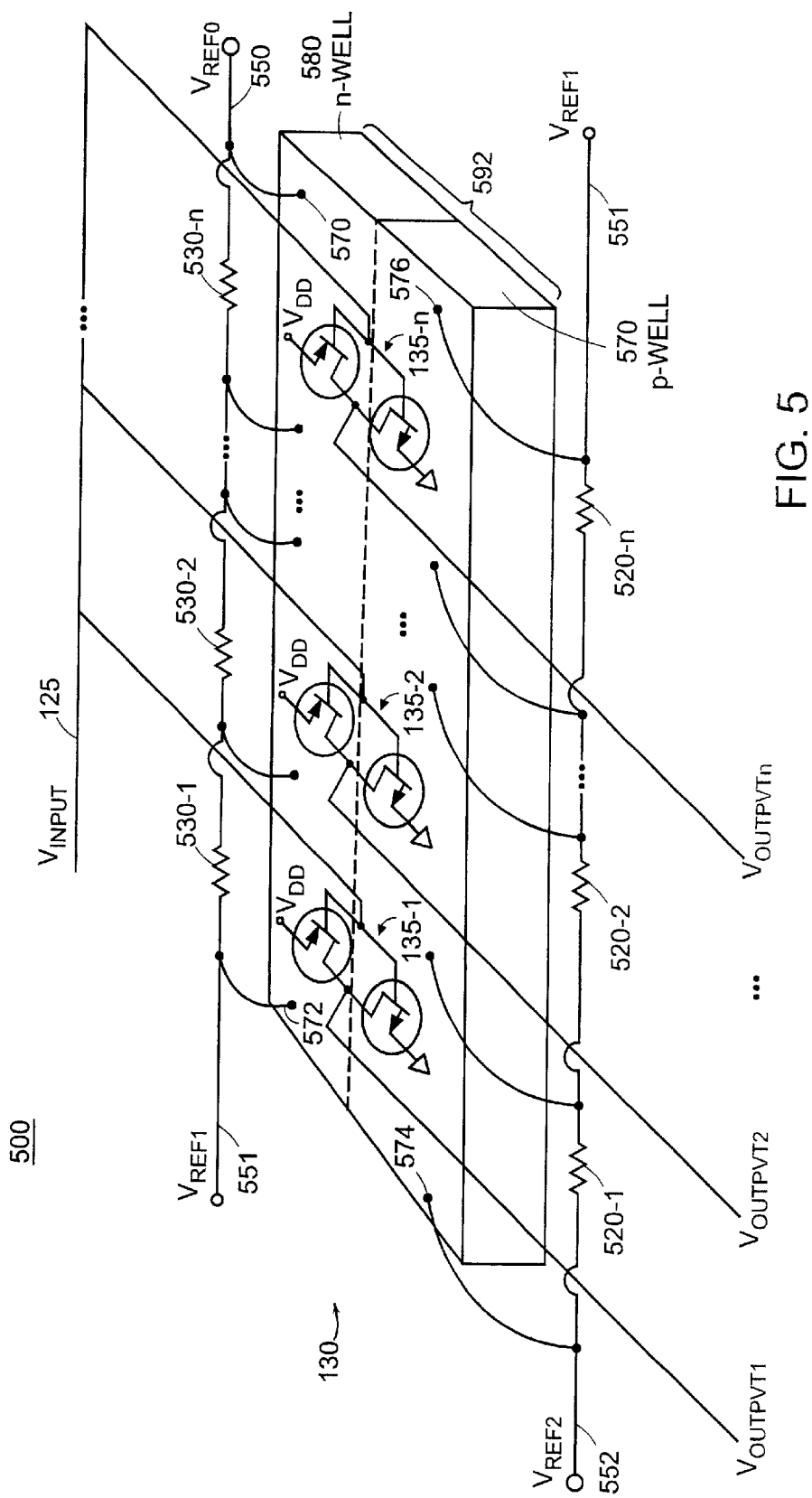
FIG. 5 is a perspective view of an array of transistor circuits and corresponding applied reference voltages according to certain principles of the present invention.

FIG. 5 is a perspective view of a semiconductor device including an array of transistor circuits according to certain principles of the present invention. As shown, array of transistor circuits 130 is fabricated in a combination of n-well substrate 580 and p-well substrate 570 of semiconductor device 500. As previously discussed, threshold voltages of inverter circuits 135-1, 135-2, . . . , 135-n can be adjusted based upon an applied well biasvoltage. As a result of the back gate effect, a well biasvoltage applied to a corresponding n-well or p-well substrate effects switching thresholds of corresponding transistor circuits formed in n-well and p-well substrates 580 and 570, respectively. n-FET devices are formed in p-well substrate 570 while p-FET devices are formed in n-well substrate 580.

Reference voltages can be applied to p-well substrate 570 and n-well substrate 580 to impart a well biasvoltage and set a switching threshold. Specifically, reference voltage $V_{REF0}$ 550 can be applied to n-well substrate 580 at electrical contact 570 while reference voltage $V_{REF1}$ 551 can be applied to n-well substrate 580 at electrical contact 572. Based on the application of these reference voltages and since n-well 580 is resistive, a gradient voltage is produced along a length of n-well substrate 580 so that unique well biasvoltages are applied to inverter circuits 135. Since the applied well biasvoltage generated at each inverter circuit 135 are unique, corresponding switching thresholds of inverter circuits 135 are also unique. In general, application of the well biasvoltage effects ON and OFF threshold voltages of a respective inverter 135. Consequently, physical dimensions of a transistor circuit such as inverter 135 need not be unique with respect to each other to vary threshold voltages of circuits. Rather, multiple inverter circuits 135 can be fabricated using similar settings and the applied reference voltage can be changed to vary corresponding switching thresholds.

Typically, n-well substrate 580 is a highly resistive semiconductor material subject to variation along its length. That is, the resistance of the substrate may not be linear along its length and can be susceptible to noise because it has a very high impedance. To ensure that gradient voltage along n-well substrate 580 is more uniform or linear, additional resistors 530-1, 530-2, . . . , 530-n having a nominal resistance value can be bridged as shown to n-well substrate 580 at various electrical contact points. In general, the chain of resistive material is a resistor divider that bridges well bias voltages to corresponding contact points along the length of substrate 580. Consequently, thresholds of sensing transistors such as n-FET or p-FET devices in inverter circuits 135 can be set to a more precise value along length of substrate 580 and A/D converter 100. A/D converter 100 can therefore produce more accurate conversions having higher resolutions. resolutions.

The value of resistors 530-1, 530-2, . . . , 530-n can be selected depending on an acceptable power consumption. For example, the impedance or resistive value of resistors 530 can be selectively chosen so that they do not cause an excess power consumption.

In a similar manner as previously discussed for n-well substrate 580, reference voltages can be applied to p-well substrate 570 to vary a sensing threshold of corresponding n-FET devices formed therein. For example, voltage reference $V_{REF2}$ can be applied at electrical contact 574 of substrate 570 while voltage reference $V_{REF1}$ can be applied at electrical contact 576 to produce a gradient voltage or well biasvoltages along a length of substrate 570. A resistor divider including resistors 520-1, 520-2, . . . , 520-n and corresponding bridges to electrical contacts on substrate 570 can ensure that corresponding thresholds of n-FET in inverter circuits 135 are more uniformly distributed as previously discussed.

Notably, a switching threshold of a corresponding inverter 135 depends on a sensing threshold of complementary n-FET and p-FET devices formed in respective p-well substrate 570 and n-well substrate 580. Thus, one substrate can be set to a common bias voltage, i.e., $V_{REF1}=V_{REP2}$ or $V_{REF0}=V_{REF1}$, while a gradient voltage is produced in the other substrate as previously discussed.

In one application, different reference voltages are applied to the semiconductor substrates. For example, $V_{REF2}$ can be set to 5 volts, $V_{REF1}$ can be set to 2.5 volts and $V_{REF0}$ can be set to 0 volts so that $V_{REF2}>V_{REF2}>V_{REF0}$. It should be noted that ends of the n-well substrate 580 and p-well substrate 570 are typically biased with different reference voltages so that corresponding thresholds of transistor circuits such as inverter circuits 135 are cumulative rather than cancel each other out.

In another embodiment, varying switching thresholds can be introduced by adjusting power supply voltage levels such as Vdd and/or Gnd of each corresponding transistor circuit supplying power to array 130. For example, changes in a power supply line can be introduced by introducing resistor divider circuits in a manner previously described for setting the voltage of a corresponding substrate although this technique can decrease the speed of inverter circuits if the impedance in a power line is too high.

A technique for generating a range of calibration voltages, reflecting a range of possible analog input voltages, can be used in the calibration process. In general, any form of linear DAC (Digital To Analog Converter) can be used to create an input voltage signal such a ramp (or any convenient order of entering the input voltage conditions) to an A/D converter device. One way to perform a calibration measurement is to switch the input line of the entire inverter array to a calibration DAC as shown as in FIG. 6 and apply an analog output via this calibration DAC to the array whilst measuring its digital output.

Calibration circuit 610 records the digital output for each analog input at LSB increments. For example, at each incremental analog voltage input, the lookup table records the inverter circuits that have changed state. Consequently, the Look-Up-Table can be used to perform a reverse mapping in normal operation to determine the value of an unknown input. As previously discussed, it is beneficial if at least one inverter circuit changes state for an incremental change such as an LSB in the input voltage.

Calibration DACs for this application can be slower speed circuits, although precise linearity of the calibration DAC is desirable to ensure A/D converter linearity. For example, the calibration DAC resolution is typically fine enough (finer than the ADC linearity) to guarantee that when it is swept over the input range, all possible output states of the ADC are exercised at least once. If the calibration DAC accuracy is finer than the ADCs, some ADC output states may be exercised more than once; this is not a problem since only one such output and any of the calibration DAC inputs need be stored in such a case.

Another method can be used to calibrate an ADC including a string of inverter circuits as illustrated in FIG. 7. For example, a technique can be used to avoid the need for disabling the inverter array to carry out the calibration or the need to use two arrays, one in calibration mode and one in normal operation. True background operation can be used to compensate for any drift in the parameters (due to environmental conditions such as temperature, shock, power supply noise . . . ) over time. This ensures that a corresponding ADC generates an appropriate output for a given unknown analog input voltage.

More specifically, the technique can include measuring the threshold of only a single inverter from the array at a time using a suitable low speed calibration reference DAC. Individual switches for each inverter that switch it either to the common input of the ADC or to the calibration DAC can be used, rather than a single switch choosing between the ADC input and the calibration DAC as in FIG. 6.

If the input is assumed random and statistically uncorrelated with the calibration algorithm, then there is a 1/n chance (n total number of inverter circuits) that the inverter being calibrated corresponds to the one biased at the threshold by the analog input of the ADC, so the chance that accuracy is lost is only 1/n. When this happens, an LSB of resolution is lost, since the next comparison step (inverter with closest threshold is less than an LSB away if the array is properly designed and the calibration cycle runs sufficiently fast so that it compensates for any drift over time). This therefore corresponds to a negligible added white noise floor of 1/n LSBs in spectral density, and is well below other typically dominant noise sources.

The calibration algorithm to construct the lookup table which may be used for the reverse mapping process in normal operation is described below. If a calibration DAC output is applied to the entire array at once as shown in FIG. 6, a record can be created including a state of the string of inverter circuits corresponding for each possible incremental step of an analog input voltage range. In normal operation, the inverter array output can be compared with the sequence of bits stored in memory to determine a value of an unknown input voltage by reverse mapping.

In one application, an array of inverter circuits is used to generate a digital sequence corresponding to an input voltage. A set of comparator circuits or a single comparator circuit (such as an inverter circuit) can be calibrated while the balance of circuits is used to perform an A/D conversion. For example, if the array includes 1000 inverter circuits set to different threshold values, a single inverter can be tested by applying an input voltage to calibrate its actual threshold while the balance of 999 inverter circuits is used to generate an A/D output value for an input voltage to be converted. During a following A/D converter cycle, a different inverter circuit can be selected and calibrated while the previously calibrated inverter circuits are used to generate an output. In this way, each inverter circuit can be individually tested during operation without interruption of using the device. Some accuracy may be lost since a selected inverter circuit will not be used in the A/D conversion cycle while it is being calibrated.

The lookup table, however, can grow very large if all inverter circuit outputs have to be stored in raw format for each possible input condition, since the arrays themselves can include several hundred or thousand of inverter circuits. Postprocessing techniques can be employed, however, to encode this information and store the lookup table much more efficiently, since the inverter outputs are approximately thermometer in nature. For example, several"bubbles" in the thermometer code possible due to mismatches at the transition point can consist mainly of M ones and N zeros, where M+N~T, where T is the total number of inverter circuits in the array. Storing M, N, and the outputs of the inverter circuits around the transition point is sufficient for storage in the look-up-table.

In FIG. 7, the threshold points of each inverter are measured sequentially, so that a further processing step is necessary to compute M, N, and the bubble positions given any given input condition; this processing is straightforward when the inverter thresholds are known.

Reverse mapping of the digital outputs to the analog inputs is also straightforward once the lookup table has been constructed as above. It is convenient to encode the digital outputs in the same way as was done for the lookup table and compare the encoded results directly.

It may be desirable to combine or modify the methods of FIGS. 6 and 7, giving rise to further variants of the preferred embodiment. In particular, it is usually allowable to take the entire ADC temporarily offline at circuit"power up" for calibration purposes while a balance of circuits are used to perform an A/D conversion. In this case, the calibration DAC may be initially applied to the entire array as in FIG. 6 initially at "power up" to fill up the lookup table with the initial calibration states. Thereafter, the method of FIG. 7 can be applied in background to keep the calibration updated against aging circuit parameters, temperature changes, and so on. Such changes are typically slow in nature and it is often acceptable for the method described in FIG. 7 to be n times slower than that of FIG. 6 since one out of n inverter circuits is calibrated at a time.

In one application, a memory device can be filled with at least partly correct A/D converter information at"power up" before any calibration has been applied yet. The lookup table can be filled with precalculated values of what the inverter outputs would be in an ideal case based on manufacturing specifications. Calibration can then be applied to refine the lookup table as discussed above.

Figure 9:
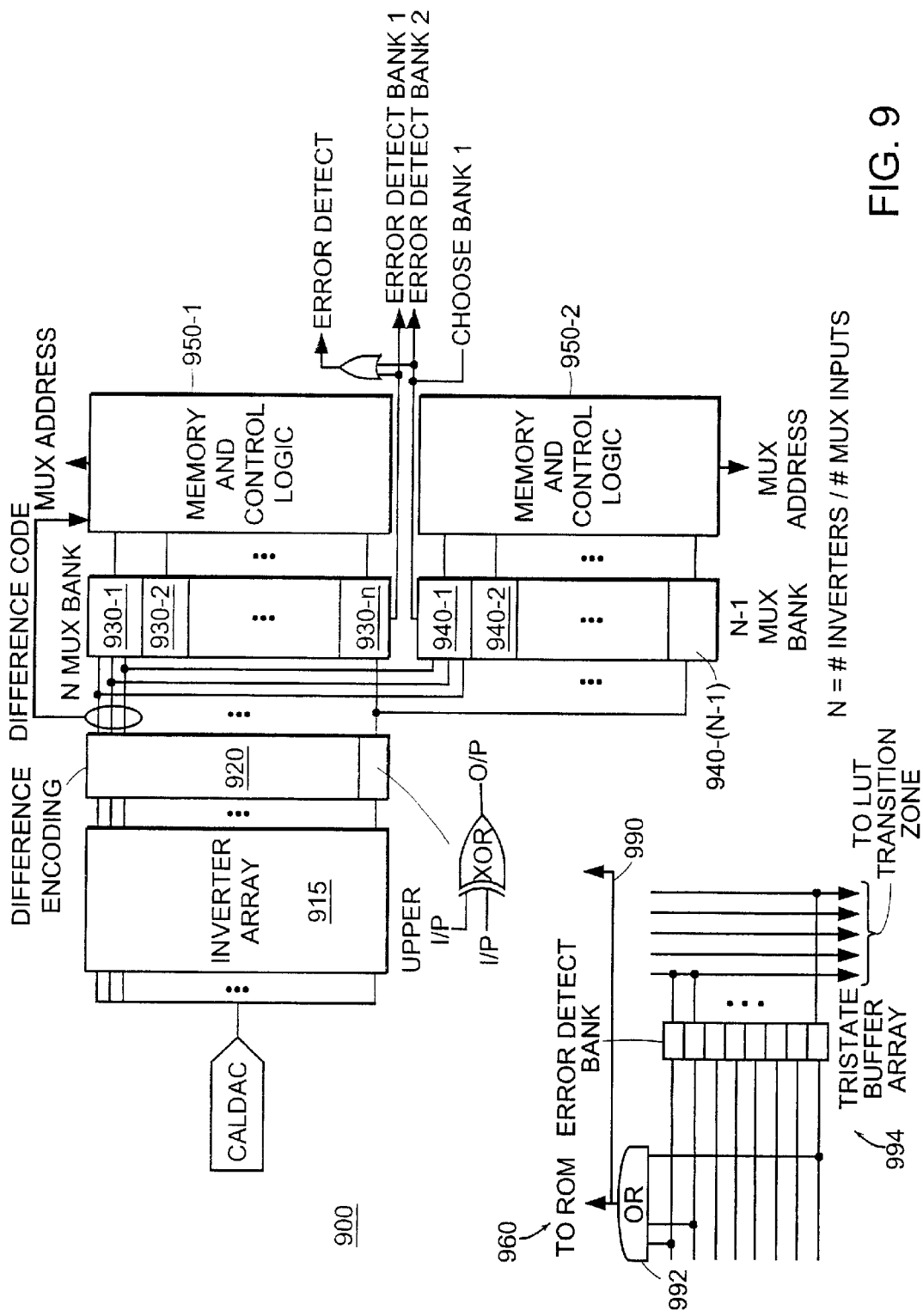
FIG. 9 is a circuit diagram illustrating functional use of an A/D device according to certain principles of the present invention.

FIG. 9 is a circuit diagram for calibrating an A/D converter device according to certain principles of the present invention. As shown, circuit 900 is used for calibration and generation of inputs to a Look-Up-Table (LUT) memory. In general, inverter array 915 can be part of the A/D converter circuit in FIG. 1 or any other applicable A/D circuit. The calibration process involves driving an A/D circuit with a known voltage and generating a map of bits corresponding to each input voltage.

Referring again to FIG. 9, outputs of inverter array 915 are first converted in a bitwise operation from a thermometer code to a difference code, e.g., a sequence of bits such as 1111111010101000000 can be converted to 00000010101000000. This preserves the transition zone of bits and its location in the overall sequence of bits. For example, the transition zone of bits includes the sequence 10101 located in the middle of the overall difference code bit sequence. When the transition zone of bits is stored in memory, leading and following strings of 0's can be truncated so the transition region is preserved in memory. Additionally, the location of the transition region in the overall sequence of bits can be preserved in memory.

It should be noted that the transition zone of bits can occur because the actual threshold of each inverter can vary even though each successive inverter in the array is set to have a lower threshold than a previous inverter. Ideally, if all inverters in the array had successively lower thresholds, there would be a single bit transition region.

Difference encoding circuit 920 can be used obtain a difference code by simply XORing each inverter output with that of the one above it (assuming the inverter array is arranged to output an increasing number of ones starting from the top; the reverse arrangement may be implemented simply by XORing with the comparator below instead) as shown in FIG. 9. Output of the topmost inverter in this case can be gated directly to the output.

It is beneficial to compute an upper bound on the size of the transition zone. For example, the size of the transition zone for a device can be predetermined through knowledge of statistical matching properties of the process used to construct an inverter array, sizes of the inverter circuits (or transistors making up the inverter circuit), and other factors such as the layout of the array. A position of the transition zone in a sequence can also be determined as discussed below.

An array of N logical OR gate circuits 930-1, 930-2, ..., 930-n (otherwise known as mux banks 1 through n), in which each OR gate circuit includes a number of inputs larger than or equal to this bound or number of bits in the transition region, and N=(number of inverter circuits)/(number of OR gate inputs), is connected to the outputs of difference encoding circuit 920 as shown. A second array of N−1 logical OR gate circuits 940-1, 940-2, ..., 940-(n−1), can be connected in parallel to the outputs of the difference encoding circuit 920.

Figure 13:
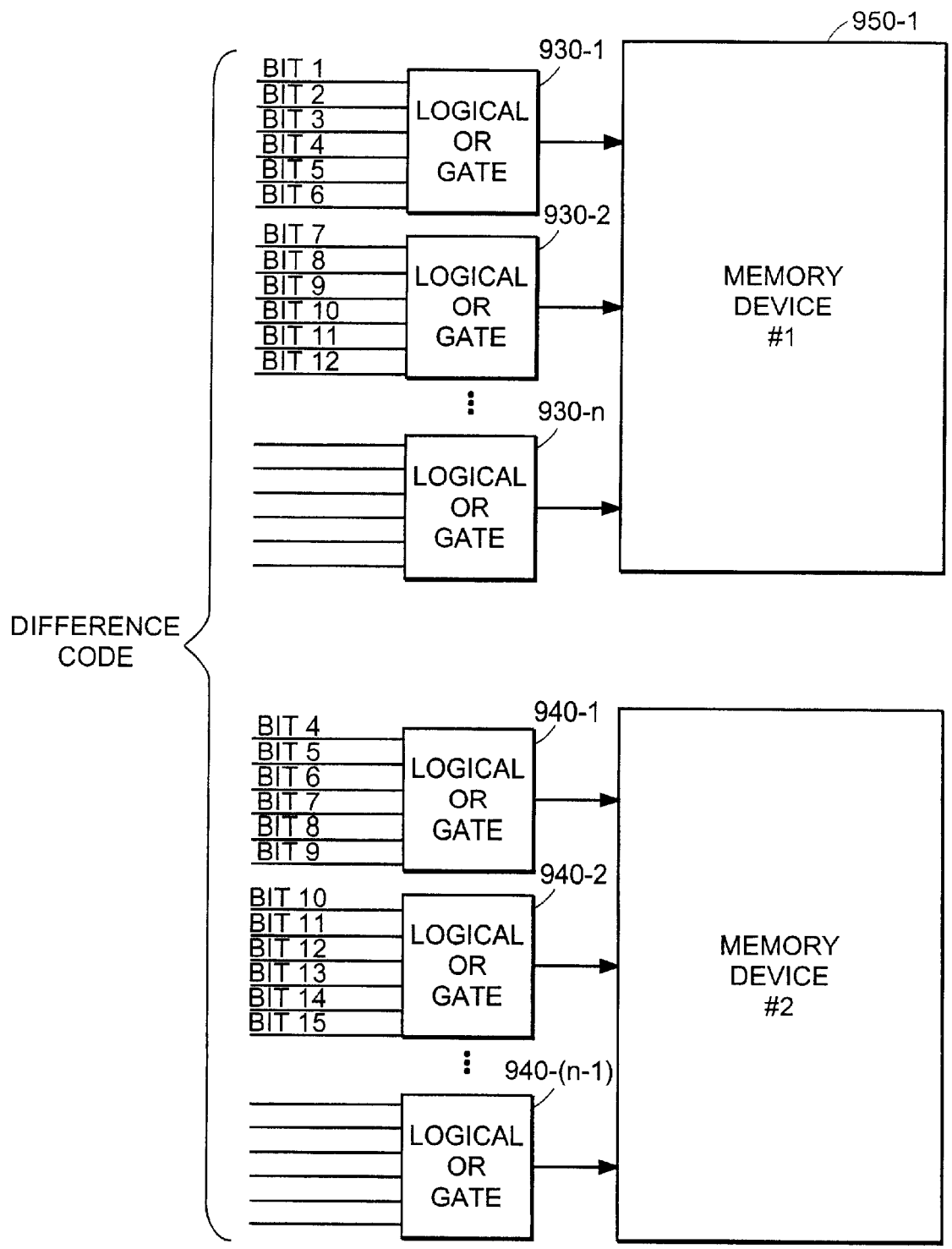
FIG. 13 is a circuit diagram for detecting a transition zone in a sequence of bits according to certain principles of the present invention.

The connection to the input of OR gates 940 are staggered as more particularly shown in FIG. 13 so that a transition zone of an applied difference code can be identified. For example, in one application the transition zone is known to be 4 bits wide. Typically, the transition zone will be smaller but this number will be used for illustrative purposes. Given that the input of each OR gate is 6 bits wide, it is certain that either bank of OR gates 930 or bank of OR gates 940 can precisely detect the location of the transition zone in a sequence of bits. When the transition zone falls within a single OR gate circuit having 6 inputs from the difference code, the corresponding memory device 950 is then used to store or retrieve information associated with the input voltage. It should be noted that the number of bits in the transition zone can vary depending on the application.

Referring again to FIG. 9, either memory 950 can generate an erroneous output, since one bank of OR gates can experience a straddle condition (transition zone falls between two consecutive OR gates in a bank) as described above. Such a condition can be flagged by an error detect circuit 960 for each bank, which is simply constructed from ANDing together neighboring multiplexers and ANDing together all the resulting lines. Specifically, if the output of two OR gates identifies a transition zone, the output of the error detection circuit will flag such a condition. Outputs of error detect circuit 960 in FIG. 9 are assumed to be active high. The choice of which bank is not straddled is derived from the error detect output.

If both error detects circuits are high, an overall error condition for the A/D converter can be generated and operation can be stopped. This condition should not occur often with proper design once the inverter statistics are known, but the yield is usually lower than 100% so this condition maybe detected if characteristics of the circuit fall outside the design limits.

The output of the OR gates in a bank that identifies the transition zone location, as well as the bank number not exhibiting an error condition, and the bit sequence itself, together uniquely identify the value of the digital input to the desired resolution (if the statistics of the process are correctly predicted and an acceptable yield is defined in deciding the size of the transition zone bound.) These are stored in memory.

As discussed, the transition zone of bits itself in addition to the location of the transition zone in a sequence of bits can be used to accurately determine an input voltage or calibrate the device. Memory can be segmented so that the unique transition zone values can be stored in a common area of memory. To convert an input voltage, a position of the transition zone is first determined. Thereafter, the specific setting of bits in the transition zone for a given input value are matched with those stored in a corresponding segment to determine the value of the input voltage.

In general, the circuit in FIG. 9 including OR gates, error detection bank, and the tristate buffer array to connect a transition zone to memory can be considered a multiplexer for our purposes. For example, such circuitry can be used to identify a transition zone and selected a set of tri-state buffers 994 that are then activated to couple the transition zone bits to memory 950. Status of error detect lines can be used to identify which memory to use. Tristate buffers 994 drive the transition zone or contiguous bit sequence to memory and control logic for comparing the transition zone of bits with those stored in a corresponding segment in memory.

Each multiplexer can be associated with a number of tristate buffers driven by the multiplexer inputs, which then drive a common bus connected to all the tristate outputs of both multiplexer banks. If the bank is activated and an error detect for that bank is low, i.e., no straddle condition is detected, and the output 990 of the multiplexer after the OR gate 992 is a logic high, then the tristate buffers generate the contents of the transition zone on the bus, and this information is then stored in memory 950.

The format of the LUT (Look-Up-Table) memory in an illustrative embodiment is shown in FIG. 10. LUT 1010 is addressed by the digital input of the calibration DAC, and at each location, the mux bank # (a single bit can suffice for this), the mux address, and the transition zone of a bit sequence are stored.

To identify the value of an input voltage, it is first determined what section of memory shall be checked to identify a value of the input voltage. For example, an input voltage produces a sequence of bits out of difference encoding circuit 920. This sequence of bits is fed to OR gate circuits 930 and 940 to determine the approximate location of the transition zone. A section of partitioned memory is then identified for precisely matching a value of the transition zone corresponding to the input voltage with the calibrated values stored in memory.

A transition zone for a device can be 4 bits. In such a case, there are at most 16 possible distinguishable values in the section of memory that can be checked to particularly match an input voltage to a known calibrated value. Consequently, the location of the transition zone in a sequence of bits approximately identifies a potential range in which the input voltage lies. Matching the sequence of bits in the transition zone with a sequence in memory supports a more accurate determination of the input voltage within the known range. Specifically, the transition zone of bits is matched with a corresponding sequence in memory.

Calibration of the A/D is done in a reverse manner. For example, a known input voltage is applied to the A/D device to produce a difference code. The location of the transition zone is identified to determine the section in memory to store the sequence of transition zone bits along with the corresponding voltage value. Within each section, the transition zone stored in memory more particularly defines the digital state of the difference code for a given input voltage.

During normal operation, i.e. normal data conversion and not calibration, it can be beneficial to reverse lookup the analog input at the ADC (which would be the digital input of the calibration DAC in calibration) by using bank number, mux address and transition zone parameters mentioned above. A brute force approach is to use a content addressable memory, but this is not required in practice. The bank number in general alternates 0 and 1 down the table, and the transition zone tends to be random in nature, but the multiplexer address is tightly correlated with the input voltage, and is linear within the bound of the size of the transition zone, since the inverter array is designed to be ideally linear with input. Therefore, the multiplexer address is multiplied by a suitable constant to derive the approximate address, and all addresses within the transition zone size bound are then examined in parallel to find a match and conclude what the input was. Thus, reverse lookup is possible in a single clock cycle using minimal circuitry. It can be virtually guaranteed to find at least one match and possibly more in the lookup table. Any match found can be chosen in a preferred order. As described earlier, this can arise as a result of finer resolution of the calibration DAC (Digital to Analog Converter) than resolution of A/D converter device being calibrated. It also can be guaranteed that a user can find at least one match through the finer calibration DAC resolution and proper design taking into account statistical variation of the inverter array as previously discussed.

Circuitry in FIGS. 9 and 10 can be further supplemented with circuitry so that each inverter circuit in an array can be calibrated individually as shown in FIG. 7. In general, this involves individually determining a threshold of each inverter circuit.

This may be done simply by using a single row of memory cells as large as the entire array to store a thermometer code; the row can be filled up after n measurement cycles. The row can thereafter be output in parallel to the circuit of FIG. 9, starting from the difference encoding circuit.

A further simplification in this case to cut the costs of bitwise operations such as difference encoding is to store the a difference code in a row of memory cells, since this does away with the need to produce a difference code array as large as the inverter array. To achieve this, a single memory cell can be used to store the output of the previous inverter measurement during the calibration. Alternatively, in yet a different circuit which does not require a row of memory cells this size, the last m outputs of the inverter measurements, where boundary in a transition zone, may be stored and the transition zone detected and stored as soon it is found. A memory size m=3x the boundary on the transition size suffices, for example, to locate the transition zone with certainty. In this case, the calibration time is reduced, since no further calibration measurement for the particular input condition is necessary.

Figure 11:
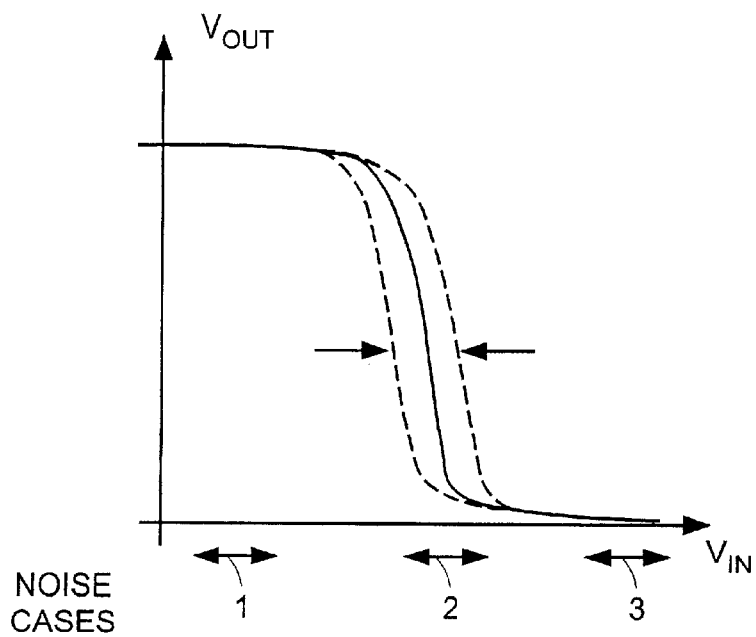
FIG. 11 is a graph illustrating how noise can effect operating characteristics of a transistor circuit.

In applications that use smaller sized inverter circuits to discriminate analog signals, environmental conditions such as thermal noise performance can be a cause for concern. For example, inverter circuits biased at their threshold can be sensitive to input noise as shown in FIG. 11. As shown in regions 1 and 3 of the inverter transfer curve, the effect from noise is generally minimal as it does not change the output. However, in region 2 around the threshold region of the inverter circuit, input noise may cause an erroneous output from the inverter.

Figure 12:
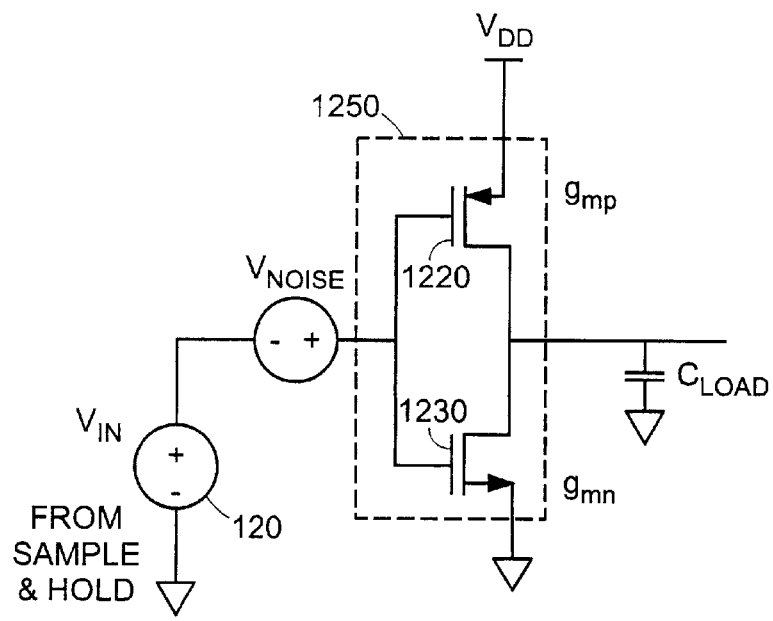
FIG. 12 is a model of a transistor circuit exposed to noise according to certain principles of the present invention.

A suitable noise model to analyze this effect is shown in FIG. 12. Noise is shown as an equivalent input noise generator 1230 at the input of inverter circuit 1250 and in series with the true analog input from sample and hold circuit 120. $C_{load}$ represents loading of inverter circuit 1250, which are typically the gate inputs of conventional second stage inverter circuits 140, which "square up" an the output signal. Around threshold region 2, both p-type transistor 1210 and n-type transistor 1220 are in saturation and exhibit respective transconductances, gmp and gmn (total transconductance gm=gmn+gmp). The circuit time constant for the purposes of calculating noise bandwidth is $t=gM/C_{load}$.

For smaller sized inverter circuits in which the (Width/Length ratio of the transistor device)~1 and for typical processes (such as supply voltage is 3.3V, Vin at threshold=1.65V, or Vthn~0.65V), (Vgs-Vthn)~1, we can write gmn~$\mu$nCox~200$\mu$ or so for typical devices. We can ignore gmp which is about 1/3 or so gmn in practice (if included, it makes the noise lower). This gives an input reference noise on the order of $5.5 \times 10^{-17}$ V$^2$/Hz.

For small inverter sizes in a second stage inverter array such as array 145 (which also can be desirable to reduce size since there are as many inverter circuits 145 in the inverter array 140 as array 130), it can be beneficial is desired to keep $C_{load}$ on the order of 5 femtofarads or so. This corresponds to about 1.5 $\mu$m$^2$ (square micrometers) of gate area and approximately minimum size also in a 100 angstrom submicron process. In this case, time constant, t, corresponds to a bandwidth of 4.5 GHz and the equivalent rms input noise with the spectral density calculated above is on the order of 500 uV. Using a 1V input dynamic range, we see that these typical values enable the construction of ADCs exhibiting 10+ bit levels of performance, which is often advantageous in practice for flash ADC performance.

Figure 8:
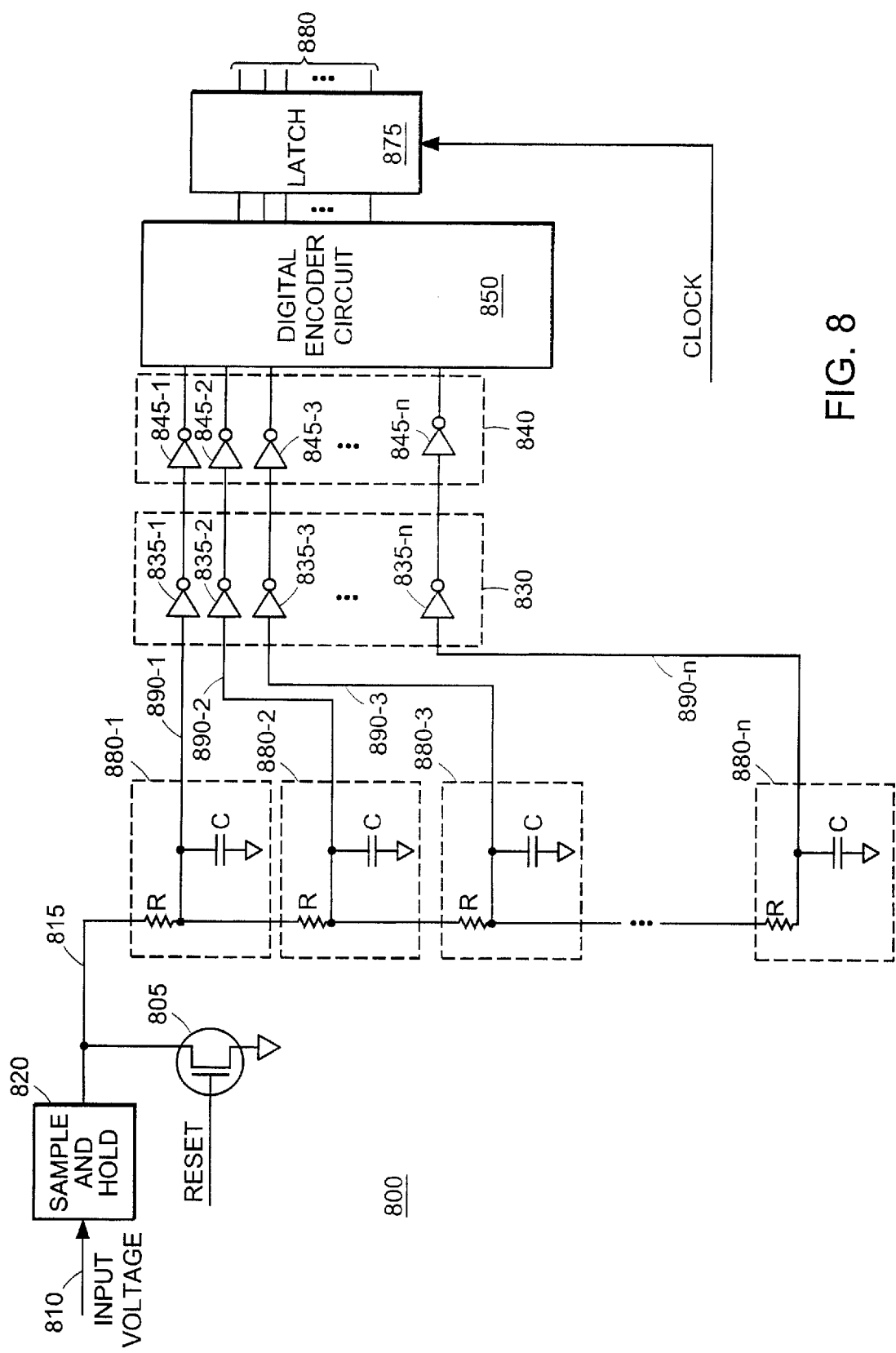
FIG. 8 is a circuit diagram of an A/D device incorporating a tapped delay line according to certain principles of the present invention.

FIG. 8 is a circuit diagram of an A/D converter device according to certain principles of the present invention. Rather than individually adjusting threshold voltages of each inverter circuit as previously discussed, inverter circuits can be implemented as similarly sized transistors having substantially equal thresholds. As shown, however, each inverter circuit 835 of circuit 800 can be coupled to a different output tap of tapped delay line 880 to produce an A/D circuit device.

Initially, transistor 805 is turned ON via "reset" signal for a specified time to initialize or ground sample voltage 815 and capacitors, C. The reset signal is then set inactive so that transistor 805 is turned OFF. At a specified time, sample and hold circuit 820 samples input voltage 810 to produce sample voltage 815 that is to be converted into a digital output 880. Alternatively, instead of transistor 805, individual reset transistors controlled by a common reset signal can be coupled to each output of a tapped delay element 880 to more quickly reset or initialize circuit 800 for a new A/D conversion.

Sample voltage 815 is fed into tapped delay line 880, which includes delay line elements 880-1, 880-2, 880-3, ..., 880-n. Each delay line element 880 can include individual or discrete resistor (R) and capacitor (C) components. In one application, the resistors R are formed from a line resistance, while capacitors C are merely the input capacitance of a corresponding inverter circuit 835 (such as corresponding gate capacitances) to which a corresponding tapped delay element 880 is coupled.

During operation, sample voltage 815 is applied to an input of tapped delay line element 880-1 at a predetermined time. Latch 875 samples the state of the output of digital encoder circuit 850 at some following predetermined time after sample voltage 815 is applied to delay line 880.

In general, when linear RC circuits are incorporated in tapped delay line 880 as shown, the time when a final voltage reached at each successive output 890 of a tapped delay element 880 depends on time constant of the RC circuits and a value of the input sample voltage 815. If enough time is allowed to pass after applying sample voltage 815, all of the outputs of the delay elements 880 will be set to the sample voltage 815 and outputs of all inverter circuits will flip states as compared to the state when they are initialized to a 0 volt input. Recall that at initialization, zero volts is applied to each inverter circuit 835 in array 830 so that corresponding outputs are set to a logic high state. The states of inverter circuits 835 change when sample voltage propagates along tapped delay line 880.

The time that it takes each inverter circuit to flip states varies depending on sample voltage 815. For higher sample voltage 815 values, more inverter circuits along the tapped delay line 880 will flip states in a shorter period of time. Conversely, fewer inverter circuits 835 will flip from their original initialized state when sample voltage 815 is a lower voltage, although the lower voltage is above a specified threshold value of inverter circuits 835 in array 830. Consequently, digital outputs of encoder circuit 850 can be latched at a single or multiple successive specified times after application of new sample voltage 815 to determine a value of the sample voltage 815.

It should be noted that the previously discussed techniques, i.e., adjusting thresholds, relying on timing and tapped delay line outputs, adjusting physical dimensions of transistor circuits . . . , can be implemented singly or in combination with each other to produce circuit devices according to the principles of the present invention.

While this invention has been particularly shown and described with references to preferred embodiments thereof, it will be understood by those skilled in the art that various changes in form and details may be made therein without departing from the scope of the invention encompassed by the appended claims.

What is claimed is:

1. An analog-to-digital converter comprising:
    an array of transistor circuits each having a switching threshold determined by intrinsic switching thresholds of at least one sensing transistor in the circuit, the sensing transistors of all transistor circuits of a set of the transistor circuits having common physical dimensions;
    an encoder that provides a digital output dependent on states of the individual transistor circuits; and
    a memory device that stores a table of bit sequences corresponding to analog input values, each bit sequence including a transition zone corresponding to an analog input value.

2. The analog-to-digital converter of claim 1, wherein a position of the transition zone in a bit sequence and logical sequence of bits in the transition zone corresponds to a particular analog input value.

3. A method of converting an analog input voltage to a digital output, the method comprising:
    applying the analog input voltage to each of multiple transistor circuits in an array of transistor circuits, the transistor circuits having switching thresholds determined by intrinsic switching thresholds of at least one sensing transistor in a corresponding transistor circuit, the sensing transistors of all transistor circuits of a set of the transistor circuits having common physical dimensions;
    generating an encoded digital output dependent on states of the individual transistor circuits;
    sampling a signal derived from the array at a predetermined time to capture a digital sequence corresponding to a voltage applied to an input of the array of transistor circuits; and
    comparing the digital sequence to values stored in a look-up table to determine the voltage plied to the input of the array of transistor circuits.

4. A method of converting an analog input voltage to a digital output, the method comprising:

applying the analog input voltage to each of multiple transistor circuits in an array of transistor circuits, the transistor circuits having switching thresholds determined by intrinsic switching thresholds of at least one sensing transistor in a corresponding transistor circuit, the sensing transistors of all transistor circuits of a set of the transistor circuits having common physical dimensions;

generating an encoded digital output dependent on states of the individual transistor circuits; and storing a table of bit sequences corresponding to analog input values of the voltage source, each bit sequence including a transition zone corresponding to an input value of the voltage source.

5. A method as in claim 4, wherein a position of the transition zone in a bit sequence and logical sequence of bits in the transition zone corresponds to a particular analog input voltage.

6. A method of supporting analog-to-digital conversions comprising:

generating a string of bits corresponding to an input voltage;

identifying a contiguous bit sequence in the string of bits corresponding to a transition zone in which at least two adjacent bits are set to different logic levels; and based on a location of the contiguous bit sequence in the string of bits, storing at least a portion of the contiguous bit sequence in memory along with a corresponding digital number representing the input voltage.

7. The method of claim 6 further comprising:

applying an input voltage to an array of inverter circuits having different thresholds to at least indirectly generate the string of bits.

8. The method of claim 6, wherein the string of bits is a difference code.

9. The method of claim 6 further comprising:

partitioning the memory into multiple segments;

allocating a segment of memory for storing multiple unique contiguous sequences of bits for different input voltages to an analog-to-digital converter device.

10. The method of claim 9, wherein each segment in memory corresponds to a location of a transition zone and the contiguous bit sequence is a transition zone of bits that is stored in a corresponding segment in memory.

11. A method for converting an analog value to a digital value comprising:

identifying a multibit transition zone in a digital representation of the analog value; and searching the memory for the digital value stored in the memory corresponding to the analog value based on the multibit transition zone and a location of the multibit transition zone in the digital representation.

12. The method of claim 11 wherein the multibit transition zone is a contiguous sequence of bits of a predetermined length.

13. The method of claim 12 wherein at least two adjacent bits in the sequence of bits are set to different logic levels.

14. An analog to digital converter comprising:

a transition circuit which identifies a multibit transition zone in a digital representation of an analog value; and a memory which stores a digital value corresponding to the analog value, the memory searched for the digital value based on the multibit transition zone and a location of the multibit transition zone in the digital representation.

15. The analog to digital converter of claim 14 wherein the multibit transition zone is a contiguous sequence of bits of a predetermined length.

16. The analog to digital converter of claim 15 wherein at least two adjacent bits in the sequence of bits are set to different logic levels.

* * * * *

UNITED STATES PATENT AND TRADEMARK OFFICE
CERTIFICATE OF CORRECTION

PATENT NO.     : 6,661,365 B1
DATED          : December 9, 2003
INVENTOR(S)    : Alexander Bugeja It is certified that error appears in the above-identified patent and that said Letters Patent is hereby corrected as shown below:

<u>Column 16,</u>
Line 66, delete "plied" and insert -- applied --

Signed and Sealed this

Twenty-fourth Day of February, 2004

JON W. DUDAS
*Acting Director of the United States Patent and Trademark Office*